United States Patent [19]
Hashimoto

[11] Patent Number: 6,094,237
[45] Date of Patent: Jul. 25, 2000

[54] CHANNEL SELECTING SYSTEM

[75] Inventor: Takeshi Hashimoto, Chiba, Japan

[73] Assignee: Sharp Kabushiki Kaisha, Osaka, Japan

[21] Appl. No.: 08/848,914

[22] Filed: May 1, 1997

[30] Foreign Application Priority Data

May 16, 1996 [JP] Japan ................................. 8-121828

[51] Int. Cl.$^7$ .................................................. H04N 5/50
[52] U.S. Cl. ......................... 348/731; 348/569; 348/570; 348/564; 348/580; 348/348; 348/352
[58] Field of Search ...................... 348/553, 563, 348/564, 565, 566, 567, 568, 569, 570, 580, 581, 582, 583, 734, 906, 731, 732, 733, 584, 588; 345/327, 328, 348, 349, 350, 351, 355, 976; H04N 5/44, 5/445, 5/50

[56] References Cited

U.S. PATENT DOCUMENTS

| | | | |
|---|---|---|---|
| 4,729,028 | 3/1988 | Micic et al. | 358/133 |
| 5,014,349 | 5/1991 | Kubo et al. | 455/189 |
| 5,283,561 | 2/1994 | Lumelski et al. | 340/721 |
| 5,303,388 | 4/1994 | Kreitman et al. | 395/159 |
| 5,485,197 | 1/1996 | Hoarty | 348/7 |
| 5,678,015 | 10/1997 | Goh | 395/355 |
| 5,710,999 | 1/1998 | Iwase et al. | 455/349 |

FOREIGN PATENT DOCUMENTS

| | | | |
|---|---|---|---|
| 6-54267 | 2/1994 | Japan | H04N 5/44 |
| 550911-A1 | 12/1992 | United Kingdom | H04N 5/44 |

OTHER PUBLICATIONS

Tyson Henry, Multidimensional Icons, The Interaction Technique Notebook, pp. 133–137, Jan. 1990.

*Primary Examiner*—Michael H. Lee
*Attorney, Agent, or Firm*—Nixon & Vanderhye P.C.

[57] ABSTRACT

A first channel selection signal generating circuit successively indicates selection of channels which can be received by the electronic tuner. A second channel selection signal generating circuit indicates selection of a particular channel. A channel selection signal switching circuit effects switching between these two outputs so as to output one of them to an electronic tuner. A digitizing circuit converts the output from the electronic tuner into its digital signal. A scan line converting circuit outputs a signal which has been formed from the digital signal by reducing the number of horizontal scan lines so that the output is stored into a texture memory, as one sub-frame image for each channel. A graphics engine subjects the image data loaded from the texture memory to a 3D image process and stores it into a video image memory. A video signal selecting circuit switches the output between the video signal from the electronic tuner and the video signal loaded from the video image memory so as to output the selected one on a display unit.

20 Claims, 11 Drawing Sheets

CHANNEL SELECTING SYSTEM

BACKGROUND OF THE INVENTION (1) Field of the Invention

The present invention relates to a channel selecting system for use in TV receivers which enables a multiple number of images corresponding to different channels to be displayed on the same screen to allow the user to select a desired channel.

(2) Description of the Prior Art

In recent years, TV receivers have been added with a variety of functions and have become able to offer the user multiple channels of video images from various video sources. With this tendency, i.e., development of television into multi-functions and multi-channels, the operation of channel selection in TV receivers has become more complicated. As a result, the operation of the remote control transmitter also has been getting more complicated.

For example, when a remote control transmitter has channel selection keys each corresponding to a respective channel, the viewer, who has not yet selected a program and needs to find a favorite program, should successively press a number of channel selection keys; a complicated operation.

When a remote control transmitter has up and down keys for channel selection, the viewer selects a favorite program whilst ascending or descending from one channel to the next using these keys. In this case, as the number of channels increases, it takes a longer time to select a desired program, resulting in a poor operability.

In order to improve the operability of such complicated remote control transmitters, some methods have been attempted to support channel selection. For example, in a channel selecting system disclosed in Japanese Patent Application Laid-Open Hei 6 No. 54,267, the image frame or display screen is divided into a plurality of small-sized frame images or sub-frame images, each of which corresponds to a different still image for a channel, enabling the contents of a multiple number of channels to be displayed in parallel.

Although the above conventional channel selecting system can permit the viewer to recognize the images of plural channels all at once, the size of each sub-frame image becomes smaller as the channels to be selected increases in number because the display of each sub-frame image is equally sized. Thus, the conventional configuration results in a view which is difficult to see.

SUMMARY OF THE INVENTION

The present invention has been devised in order to eliminate the above problems, and it is therefore an object of the present invention to provide a channel selecting system which is able to offer simple selection of a desired channel from a multiple number of channels.

The present invention has been achieved to attain the above object, and the gist is as follows:

First, in accordance with the first aspect of the invention, a channel selecting system comprises:

a tuner circuit which selectively receives one channel in accordance with an indication signal indicating a channel to be selected and demodulates the video signal;

a first channel selection indicating circuit for outputting an indication signal which successively designates a plurality of prescribed channels, one to another, to the tuner circuit;

a sub-frame image generating means which samples the video signal outputted from the tuner circuit, taking one frame for each channel at intervals of a predetermined period and thins the number of the horizontal scan lines, producing a sub-frame image to be outputted as video information;

a sub-frame image memory for storing the video information of each sub-frame image outputted from the sub-frame image generating means, at an address associated with the channel number;

an image processing means which forms a polyhedral icon having faces each being constituted from a sub-frame image for a respective channel stored in correspondence to a respective address in the sub-frame image memory, and subjects the polyhedral icon to a three-dimensional image processing;

a video image memory for storing the output from the image processing means; and a rotation instructing means for instructing a rotation of the polyhedral icon, up, down, left or right, to the image processing means.

Next, in accordance with the second aspect of the invention, a channel selecting system having the above first feature, further comprises:

a channel selecting means for outputting a channel selection signal which determines the channel corresponding to the front-positioned sub-frame image of the polyhedron to be a specified channel;

a second channel selection indicating circuit which receives the channel selection signal and outputs an indication signal to instruct the tuner circuit to select the specified channel;

a video signal selecting circuit which selects either the video signal outputted from the tuner circuit or the video signal outputted from the video image memory and outputs the selected signal;

a display selecting means for designating the selection of either the video output from the tuner circuit or the video output from the video image memory to the video signal selecting circuit; and a channel selection switching circuit which selects either the output from the first channel selection indicating circuit or the output from the second channel selection indicating circuit in accordance with the instructions from the display selecting means, and outputs the selected output to the tuner circuit.

In accordance with the third aspect of the invention, a channel selecting system comprises:

a first tuner circuit which selectively receives one channel in accordance with an indication signal indicating a channel to be selected and demodulates the video signal;

a second tuner circuit which selectively receives one channel in accordance with an indication signal indicating a channel to be selected and demodulates the video signal;

a tuner selecting circuit for effecting switching between the output from the first tuner circuit and the output from the second tuner circuit;

a first channel selection indicating circuit for outputting an indication signal which successively designates a plurality of prescribed channels, one to another, to the first tuner circuit or the second tuner circuit;

a sub-frame image generating means which samples the video signal outputted from the first tuner circuit or the second tuner circuit, taking one frame for each channel at intervals of a predetermined period and thins the number of the horizontal scan lines, producing a sub-frame image to be outputted as video information;

a sub-frame image memory for storing the video information of each sub-frame image outputted from the sub-frame image generating means, at an address associated with the channel number received by the first tuner circuit or the second tuner circuit;

an image processing means which forms for each of the first tuner circuit and the second tuner circuit, a polyhedral icon having faces each being constituted from a sub-frame image for a respective channel stored in correspondence to a respective address in the sub-frame image memory, and subjects the polyhedral icon to a three-dimensional image processing;

a video image memory for storing the output from the image processing means;

a rotation instructing means for instructing a rotation of the polyhedral icon corresponding to the first tuner circuit or the second tuner circuit, up, down, left or right, to the image processing means; and a reception selecting means for selecting one of the polyhedral icons corresponding to the first or second tuner circuit and outputting instructions for switching to tuner selecting circuit.

Further, in accordance with the fourth aspect of the invention, a channel selecting system having the above third feature, further comprises:

a channel selecting means for outputting a channel selection signal which determines the channel corresponding to the front-positioned sub-frame image of the polyhedron to be a specified channel;

a second channel selection indicating circuit which receives the channel selection signal and outputs an indication signal to instruct the first or second tuner circuit to select the specified channel;

a video signal selecting circuit which selects either the video signal outputted from the first or second tuner circuit or the video signal outputted from the video image memory and outputs the selected signal;

a display selecting means for designating the selection of either the video output from the first or second tuner circuit or the video output from the video image memory; and a channel selection switching circuit which selects either the output from the first channel selection indicating circuit or the output from the second channel selection indicating circuit in accordance with the instructions from the display selecting means, and outputs the selected output to the first or second tuner circuit.

Next, in accordance with the fifth aspect of the invention, a channel selecting system having the above second feature, further comprises: a remote control transmitter; and a receiver circuit for receiving the transmission signal from the remote control transmitter, characterized in that the remote control transmitter comprises a rotation instructing means, the channel selecting means and the display selecting means, and the rotation instructing means instructs the image processing means for three-dimensional image processing to make a rotation of the polyhedral icon in the up/down or left/right direction.

Moreover, in accordance with the sixth aspect of the invention, a channel selecting system having the above fourth feature, further comprises: a remote control transmitter; and a receiver circuit for receiving the transmission signal from the remote control transmitter, characterized in that the remote control transmitter comprises a rotation instructing means, the channel selecting means and the display selecting means, and the rotation instructing means instructs the image processing means for three-dimensional image processing to make a rotation of the polyhedral icon corresponding to the first or second tuner circuit, in the up/down or left/right direction.

Furthermore, in accordance with the seventh aspect of the invention, a channel selecting system having the above forth feature, further comprises: a remote control transmitter; and a receiver circuit for receiving the transmission signal from the remote control transmitter, characterized in that the remote control transmitter comprises a rotation instructing means, the channel selecting means, the display selecting means and a reception selecting means, and the rotation instructing means instructs the image processing means for subjecting a polyhedral icon to a three-dimensional image process to make a rotation of the polyhedral icon corresponding to the first or second tuner circuit, in the up/down or left/right direction, and the reception selecting means selects either the polyhedral icon corresponding to the first tuner circuit or the polyhedral icon corresponding to the second tuner circuit and outputs switching instructions to the tuner selecting circuit.

Subsequently, in accordance with the eighth aspect of the invention, a channel selecting system having the above third feature, characterized in that the first tuner circuit is a receiver circuit for ground TV broadcasting and the second tuner circuit is a receiver circuit for cable TV broadcasting.

In accordance with the ninth aspect of the invention, a channel selecting system having the above fourth feature, characterized in that the first tuner circuit is a receiver circuit for ground TV broadcasting and the second tuner circuit is a receiver circuit for cable TV broadcasting.

Next, in accordance with the tenth aspect of the invention, a channel selecting system having the above seventh feature, characterized in that the first tuner circuit is a receiver circuit for ground TV broadcasting and the second tuner circuit is a receiver circuit for cable TV broadcasting.

Further, in accordance with the eleventh aspect of the invention, a channel selecting system having the above third feature, characterized in that the first tuner circuit is a receiver circuit for ground TV broadcasting and the second tuner circuit is a receiver circuit for satellite TV broadcasting.

Next, in accordance with the twelfth aspect of the invention, a channel selecting system having the above fourth feature, characterized in that the first tuner circuit is a receiver circuit for ground TV broadcasting and the second tuner circuit is a receiver circuit for satellite TV broadcasting.

Finally, in accordance with the thirteenth aspect of the invention, a channel selecting system having the above seventh feature, characterized in that the first tuner circuit is a receiver circuit for ground TV broadcasting and the second tuner circuit is a receiver circuit for satellite TV broadcasting.

As thus configured, in accordance with the channel selecting system of the first feature of the invention, it is possible for the viewer to simultaneously watch a plurality of channels received through the tuner circuit using a polyhedral icon constituted by the faces of sub-frame images of the channels. Further, it is possible to see any one channel of the sub-frame images at the front position by rotating the polyhedral icon.

In accordance with the channel selecting system of the second feature of the invention, when the channel of the sub-frame image at the front position is chosen, the tuner circuit can select this chosen channel allowing a display of this selected video image.

The channel selecting system of the third feature of the invention has a plurality of tuner circuits and provide a plurality of polyhedral icons corresponding to respective tuner circuits. Therefore, it is possible for the viewer to simultaneously watch a plurality of channels received through each tuner circuit in a 3D display image. Further, it is possible to see any one channel of the sub-frame images at the front position by rotating the polyhedral icon.

In accordance with the channel selecting system of the fourth feature of the invention, the system has a plurality of tuner circuits and providing a plurality of polyhedral icons corresponding to respective tuner circuits. By selecting these icons, when a channel of the sub-frame image at the front position is chosen, arbitrary channel of the selected tuner circuit is chosen, which makes possible to see a display of this selected video image.

In the channel selecting systems according to the fifth, sixth and seventh feature of the invention, it is possible to perform channel selection from a remote control transmitter.

The channel selecting systems according to the eighth through tenth features of the invention, can receive the ground TV broadcasting and the cable TV broadcasting. Polyhedral icons corresponding to respective tuner circuits are used to select a channel of the front-positioned sub-frame image, whereby it is possible to select an arbitrary channel of the ground TV broadcasting or the cable TV broadcasting and to watch the video image thereof.

The channel selecting systems according to the eleventh through thirteenth features of the invention, can receive the ground TV broadcasting and the satellite TV broadcasting. Polyhedral icons corresponding to respective tuner circuits are used to select a channel of the front-positioned sub-frame image, whereby it is possible to select an arbitrary channel of the ground TV broadcasting or the satellite TV broadcasting and to watch the video program thereof.

DESCRIPTION OF THE PREFERRED EMBODIMENTS

The embodiment of the present invention will hereinafter be described in detail with reference to the accompanying drawings.

Figure 1:
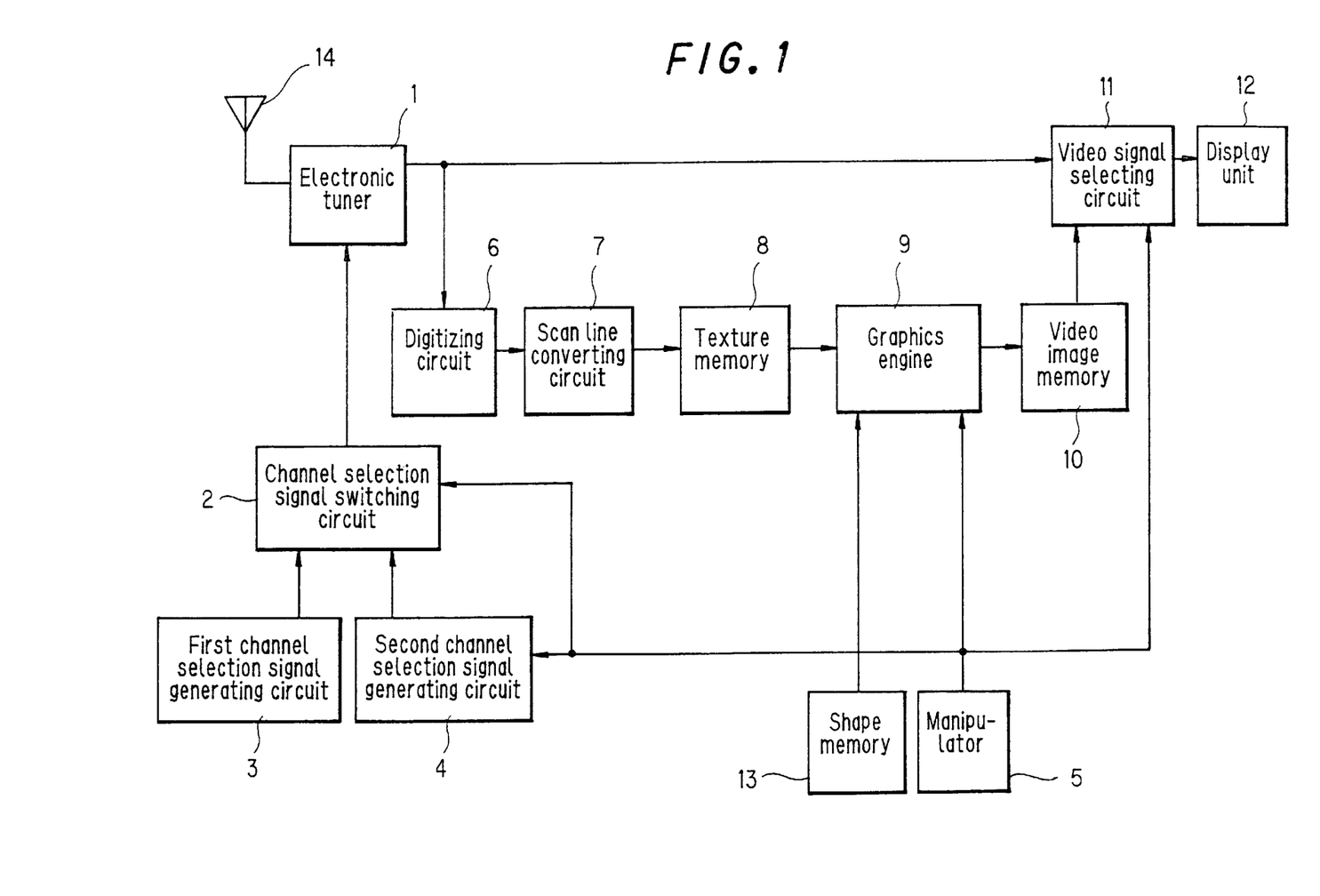
FIG. 1 is a block diagram showing a channel selecting system according to the first embodiment of the invention.

FIG. 1 is a block diagram showing a channel selecting system in accordance with the first embodiment of the invention. The channel selecting system of this embodiment is applied to a TV receiver. In this system, an electronic tuner 1 is a tuner circuit which may be of a voltage synthesizer type or of a frequency synthesizer type. The tuner selects a particular channel signal from ground TV-broadcasting signals received through an aerial 14, to thereby demodulate the video and sound signals. A first channel selection signal generating circuit 3 is a circuit for generating a channel selection signal that successively designates all the channels within the frequency range which can be received by electronic tuner 1. The channel selection signal is one which designates a tuning voltage when the tuner is of a voltage synthesizer type, whereas it is one which designates a tuning frequency when the tuner is of a frequency synthesizer type. A second channel selection signal generating circuit 4 is a circuit which generates a channel selection signal for designating selection of a particular channel in response to channel selection instructions from a manipulator 5. As channel selection signal switching circuit 2 receives instructions from manipulator 5, it selects one channel selection signal, the output from first channel selection signal generating circuit 3 or from second channel selection signal generating circuit 4 to output it to electronic tuner 1. A digitizing circuit 6 samples the video signal for each channel, the output from electronic tuner 1, taking one frame as one unit, at intervals of a predetermined period and converts it into a digital signal. A scan line converting circuit 7 outputs a signal which has been formed by thinning the output from digitizing circuit 6 or by reducing the number of horizontal scan lines. Digitizing circuit 6 and scan line converting circuit 7 constitute a sub-frame image generating means. A texture memory 8 stores the output from scan line converting circuit 7, each sub-frame image from a different channel being one frame unit.

A graphics engine 9 is a three-dimensional image processing circuit of a polygonal processing type with a texture mapping function. Graphics engine 9 performs texture mapping of the image data for each frame loaded from texture memory 8, onto the data of a 3D-figure from a shape memory 13 and stores the resultant into a video image memory 10. Shape memory 13 has stored multi-channel selector shapes, which are polyhedral icons for channel selection, as vertex data of all the polygons constituting each shape. A video signal selecting circuit 11, in accordance with the selecting instructions from manipulator 5, switches the output between the video signal from electronic tuner 1 and the video signal loaded from video image memory 10 so as to display the selected video image on a display unit 12.

Figure 2:
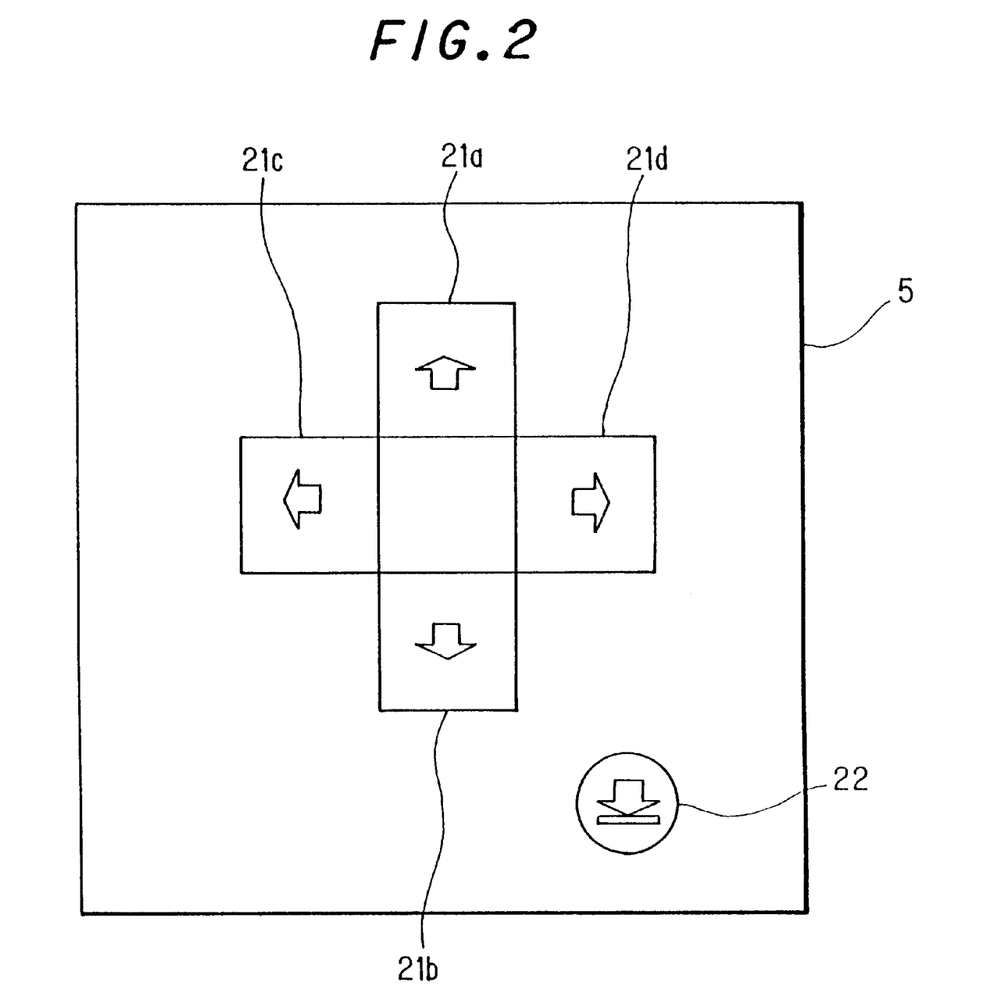
FIG. 2 is a view showing an example of a manipulator.

Next, an example of the aforementioned manipulator 5 is illustrated in FIG. 2. In this embodiment, manipulator 5 is provided in a remote control transmitter, which transmits remote control signals to a receiver circuit in the TV receiver apparatus. Control keys 21a, 21b, 21c and 21d determine the rotation of the multi-channel selector in up/down and left/right directions. A display selecting key 22 is used to select a particular channel, and also used to perform switching between the video image display from electronic tuner 1 and the display of the multi-channel selector.

Figure 3:
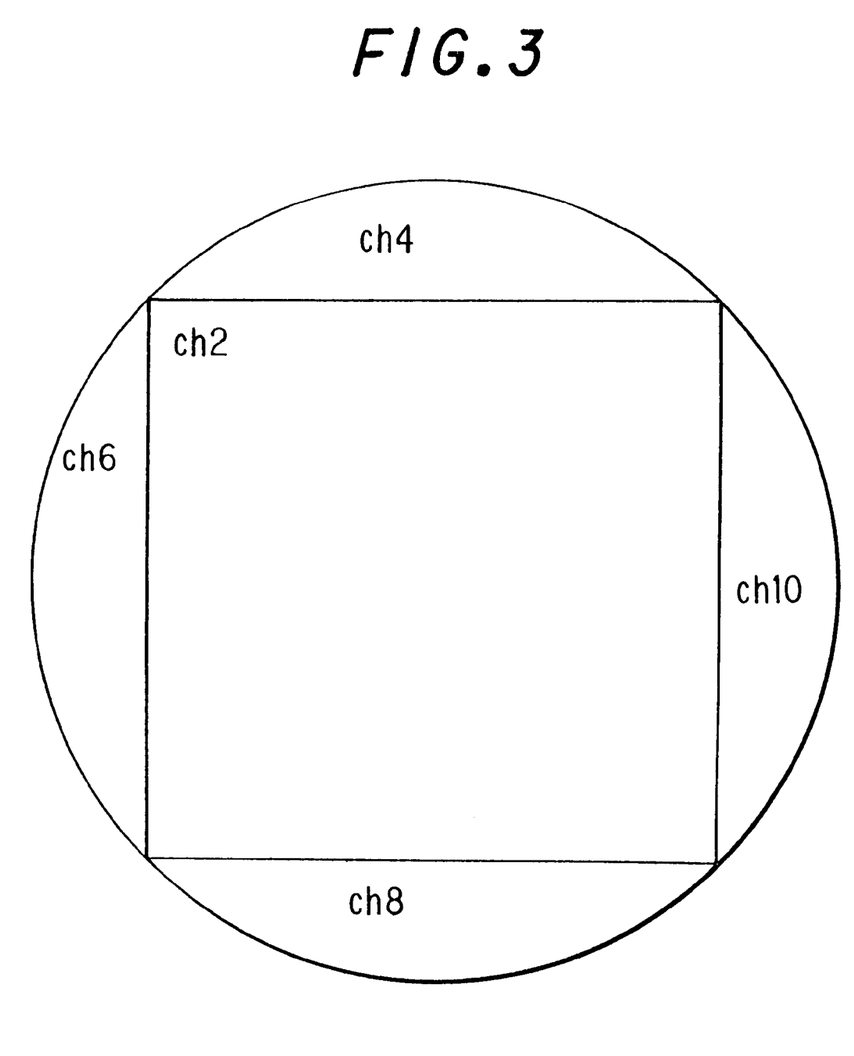
FIG. 3 is a view showing a display example of a multi-channel selector.

FIG. 3 shows a display example of a multi-channel selector. A front-positioned sub-frame image therearound corresponds to the image of channel 2 while four sub-frame images correspond to the images of channels 4, 6, 8 and 10.

Next, the operation of channel selection in the channel selecting system of this embodiment will be described. First, when display selecting key 22 in manipulator 5 is operated, the video signal loaded from video image memory 10 is selected by video signal selecting circuit 11 and is connected to display unit 12 so that it displays the multi-channel selector of FIG. 3 while the channel selection signal from first channel selection signal generating circuit 3 is connected to electronic tuner 1 by channel selection signal switching circuit 2. First channel selection signal generating circuit 3 generates a channel selection signal which allows selection of channels in a prescribed order and this is supplied to electronic tuner 1. Electronic tuner 1, in accordance with the channel selection signal which designates periodically and successively changing channels, demodulates the selected channel signal into its video signal. Digitizing circuit 6 samples the video signal for each channel during a single frame term at regular intervals for creating a compressed, sub-frame image for each channel. In scan line converting circuit 7, the data corresponding to prescribed scan lines is extracted from the output signal from digitizing circuit 6 or the arithmetic mean of data on two adjoining scan lines is calculated, and the thus extracted result is outputted as the signal representing a sub-frame image with a reduced number of scan lines. The thus obtained sets of information on the sub-frame images for different channels are stored together with the data of their channel number into texture memory 8 at respective addresses corresponding to the channels. The storage content in texture memory 8 is always updated periodically while first channel selection signal generating circuit 3 is connected to electronic tuner 1.

Figure 4:
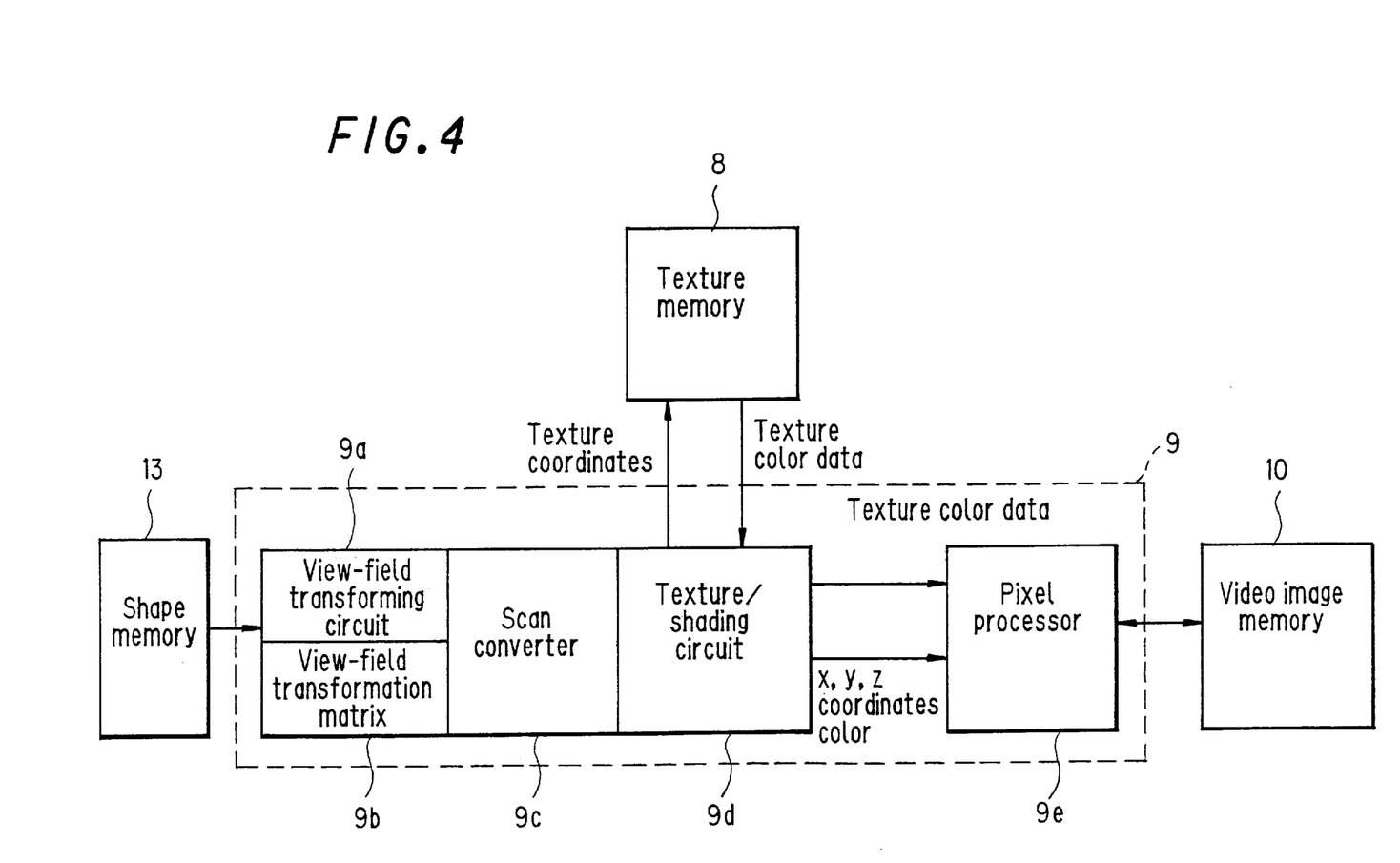
FIG. 4 is a functional block diagram of a graphics engine.

Referring next to FIG. 4 which is a functional block diagram of graphics engine 9, the function of graphics engine 9 will be described. A view-field transforming circuit 9a performs a rotation of a 3D shape by multiplying vertex data of the 3D shape inputted from shape memory 13 with a view-field transformation matrix. A view-field transformation matrix circuit 9b generates a view-field transformation matrix of 4×4 elements. A scan converter 9c slices each polygon line by line and generates coordinate information of the edges of each polygon. A texture and shading circuit 9d generates texture coordinates associated with each pixel, from the left to the right on each line sliced from the polygon, reads out texture color data corresponding to the texture coordinates from texture memory 8, and effects a shading process for shading each pixel from the left to the right on each line of the polygon. Thus, for each pixel from the left to the right on one line of the polygon, x, y and z coordinates, color and texture color data are produced. A pixel processor 9e, in response to this output, synthesizes the 3D coordinates of each line of individual polygons, colors, texture color data, then video data is recorded in correspondence to two-dimensional, or xy coordinates in video image memory 10. Hidden-surface removal is performed as required, by the Z-buffer method.

Figure 5:
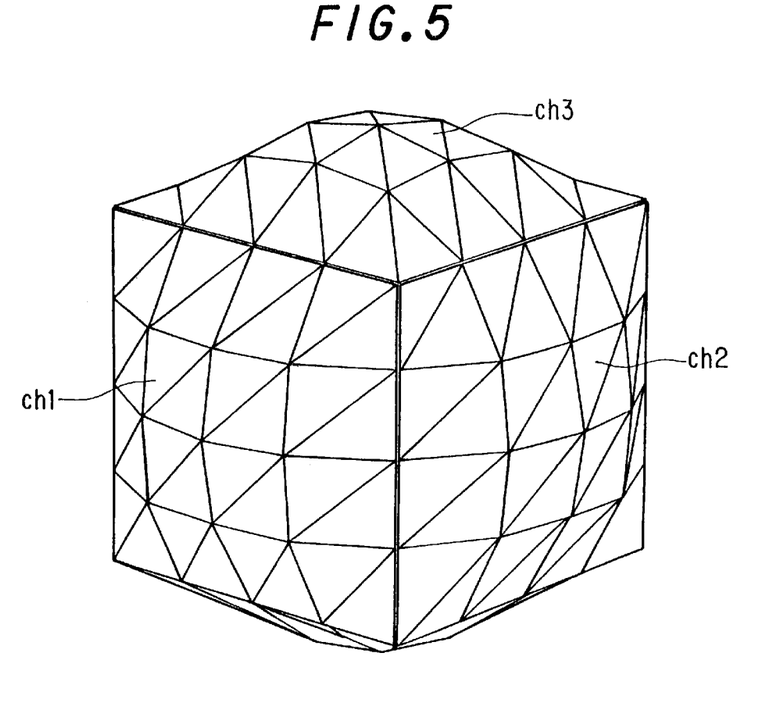
FIG. 5 is a view showing a state where each face constituting a multi-channel selector is divided into triangular polygons.

Here, since graphics engine 9 is an image processing circuit which can effect fast 3D rendering of triangles only, 3D shapes need to be divided into combinations of triangles before rendering. FIG. 5 shows a state where a cubic figure with its faces warped outwards is used as a multi-channel selector and each constituting face is divided into triangular polygons. This triangular polygon can be represented by three sets of 3D coordinates and these pieces of data have been stored in shape memory 13. Each face of the multi-channel selector shown in FIG. 5 is divided into 32 triangular polygons. That is, 576 (6×32×3=576) pieces of 3D coordinate data are stored in shape memory 13.

Figure 6:
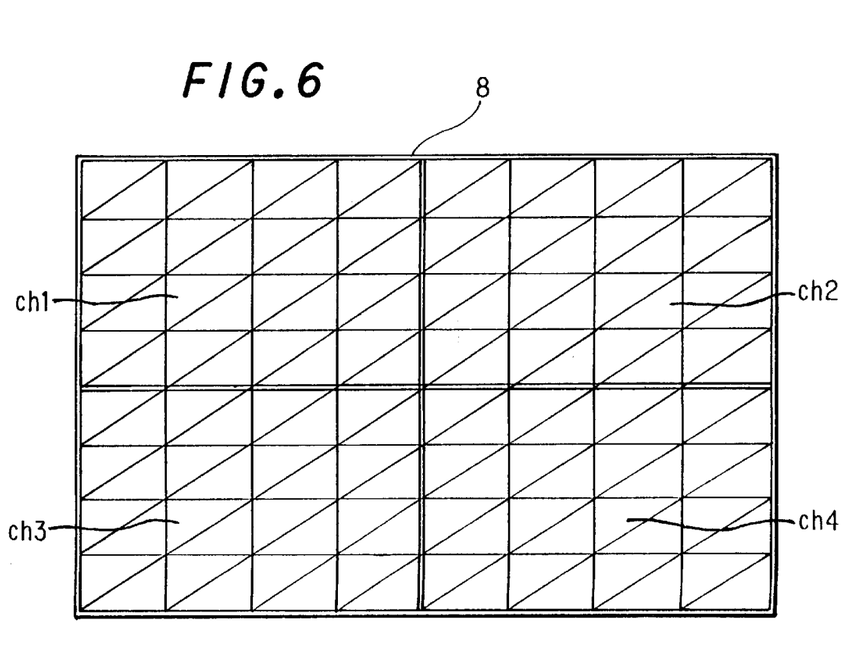
FIG. 6 is a view showing a storage state of image data stored in a texture memory.

FIG. 6 shows a storage state of the frame data for sub-frame images stored in texture memory 8. The pieces of data for sub-frame images ch.1 to ch.4 are divided into small triangular areas so that these areas are each made correspondent to triangular polygons in the faces constituting the multi-channel selector stored in shape memory 13.

Figure 7A:
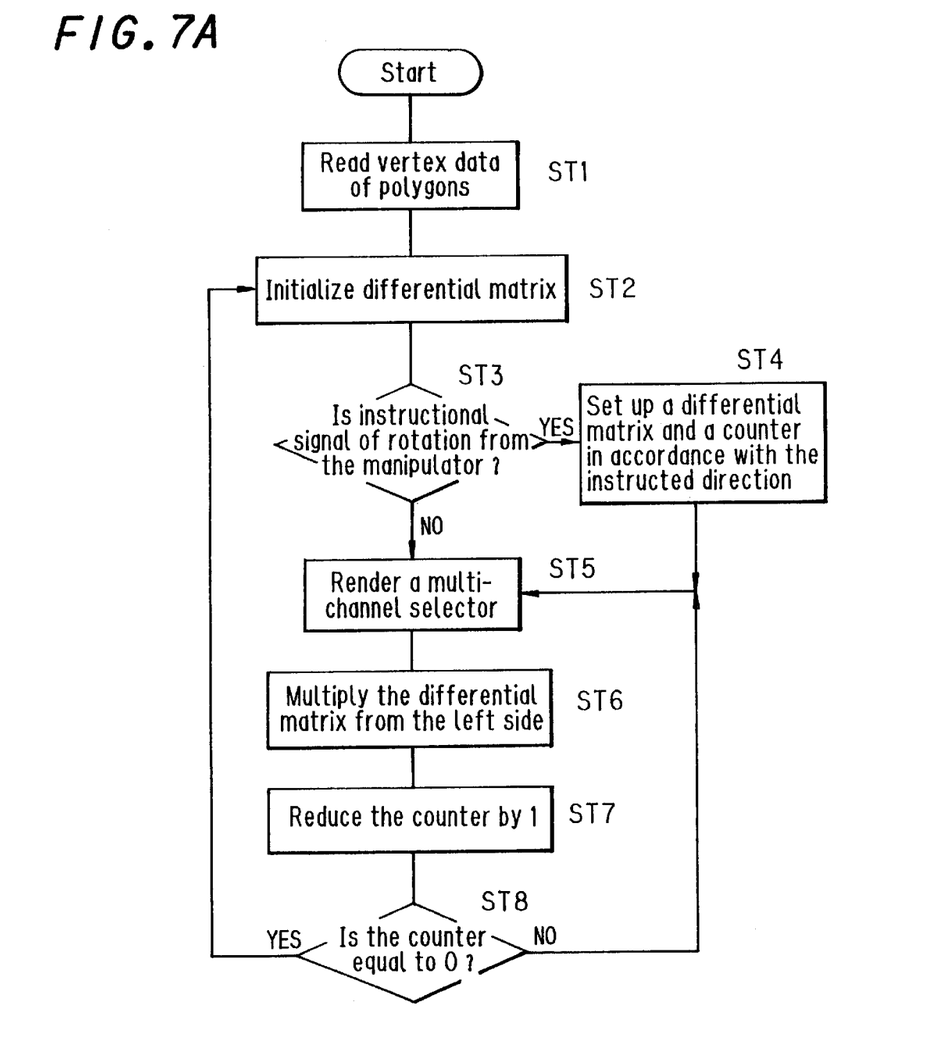
FIG. 7A is a flowchart illustrating a view-field transforming process by a graphics engine.

Next, referring to a flowchart in FIG. 7A, a view-field transforming process in graphics engine 9 will be described. In this embodiment, a rotation of a prescribed rotational angle is effected by multiple sub-rotations to make the display of the rotation smooth. First, the vertex data representing the polygons constituting each face of the multi-channel selector is read out from shape data memory 13 (ST1). A matrix, called a differential matrix for view-field transformation is initialized (ST2). Then, it is judged whether an instructional signal that indicates a rotation, up or down, left or right, of the multi-channel selector has been inputted from control keys 21a–21d of manipulator 5 (ST3). When an instructional signal is inputted, a differential matrix and a counter are set up according to the instructions (ST4). Subsequently, the multi-channel selector is rendered (ST5). Next, the differential matrix is multiplied from the left side of the data (ST6), and the counter is decreased by 1 (ST7). Then, it is judged if the counter is equal to zero (ST8). If not, the operation returns to ST5, whereas, if it is zero, the operation returns to ST2.

Figure 7B:
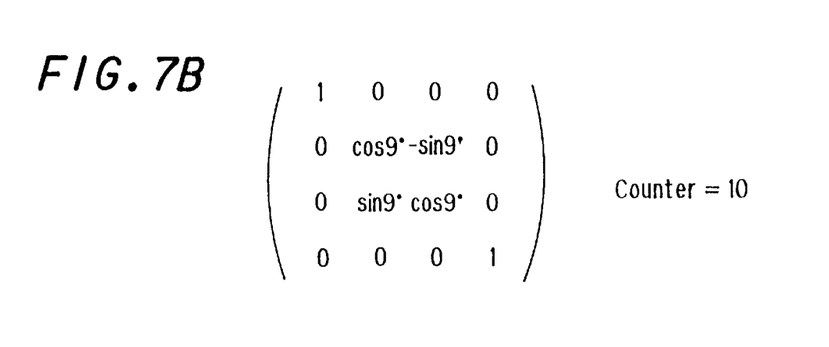
FIG. 7B shows an example of a differential matrix.

FIG. 7B is an example of a differential matrix. This example illustrates a case in which the multi-channel selector is rotated 90° on the y-z plane about the x-axis, performing ten 9° rotations. Hence, the counter is set at 10, and decreased by 1 for each rotation.

FIG. 8 shows the evolution of rotation of the multi-channel selector displayed on display unit 12 when it rotates 90° upwards. FIG. 8(a) shows the initial mode of the multi-channel selector displayed on the screen of the display unit 12. When the viewer operates control key 21a of manipulator 5 for selecting channel 8, the display changes into that shown in FIG. 8(b), that is, the sub-frame image of channel 2 which has been in the center, starts to rotate upwards so that the sub-frame image of channel 8 moves forwards. During this rotation, shadows 2s and 8s are added in order to produce a 3-dimensional sensation.

Figure 8A:
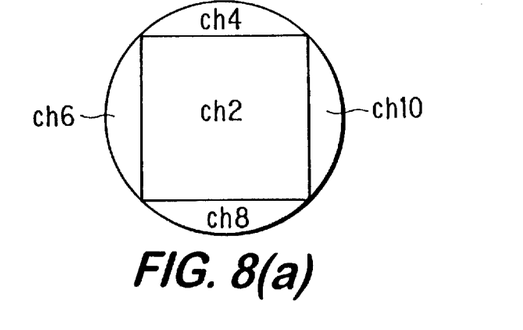
FIG. 8 is a diagram showing the evolution of rotation of a multi-channel selector.
Figure 8B:
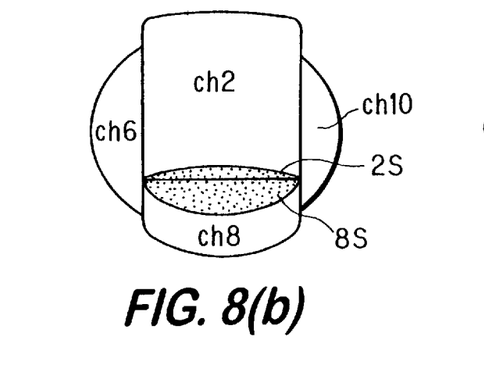
Figure 8C:
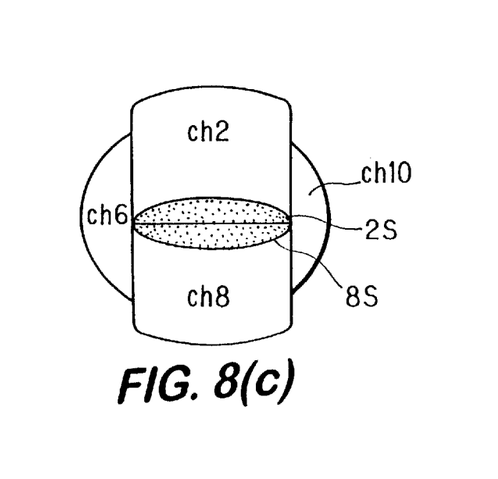
Figure 8D:
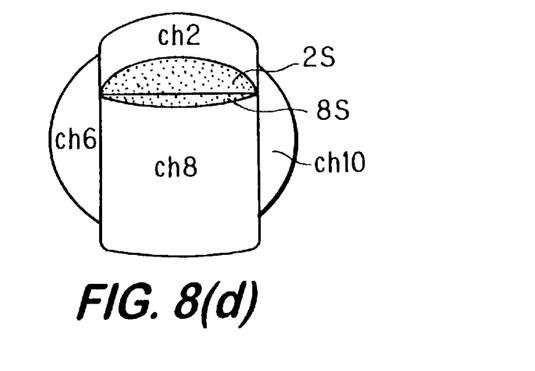
Figure 8E:
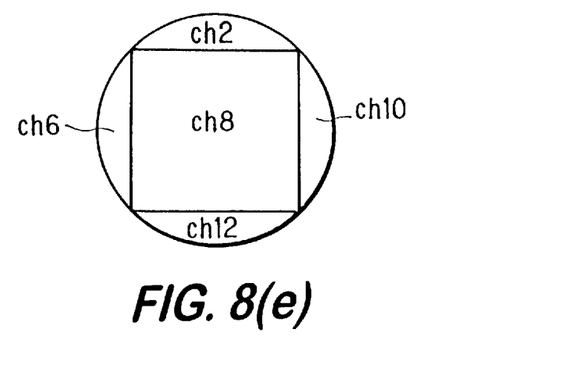

FIG. 8(c) shows a state where it is rotated 45° with the sub-frame images of channels 2 and 8 appearing equally. FIG. 8(d) shows a further progress of the rotation where the sub-frame image of channel 8 appearing larger. FIG. 8(e) shows a case where channel 8 is located at the center after the completion of the 90° rotation.

When in the above state of FIG. 8(e), channel 8 is selected by operating display selecting key 22 on the manipulator 5, channel selection signal switching circuit 2, in response to this channel selection signal, connects the output from second channel selection signal generating circuit 4 to electronic tuner 1, at the same time, second channel selection signal generating circuit 4 outputs a signal indicating channel 8. Video signal selecting circuit 11 then, in response to the channel selection signal, connects the output from electronic tuner 1 to display unit 12 so that the video image of channel 8 is displayed.

As stated above, it is possible to watch a plurality of channel images received through electronic tuner 1, simultaneously in a three-dimensional representation. Further, when the remote control transmitter is operated, the polyhedral icon rotates so as to allow the sub-frame image of a channel to be seen in the front position. Thus, as the viewer chooses the front-positioned channel of the sub-frame image, electronic tuner 1 selects the thus chosen channel, allowing the viewer to watch the video image. In this way, the viewer can select a desired channel to be displayed in a simple operation whilst watching the video image from any position.

Figure 9:
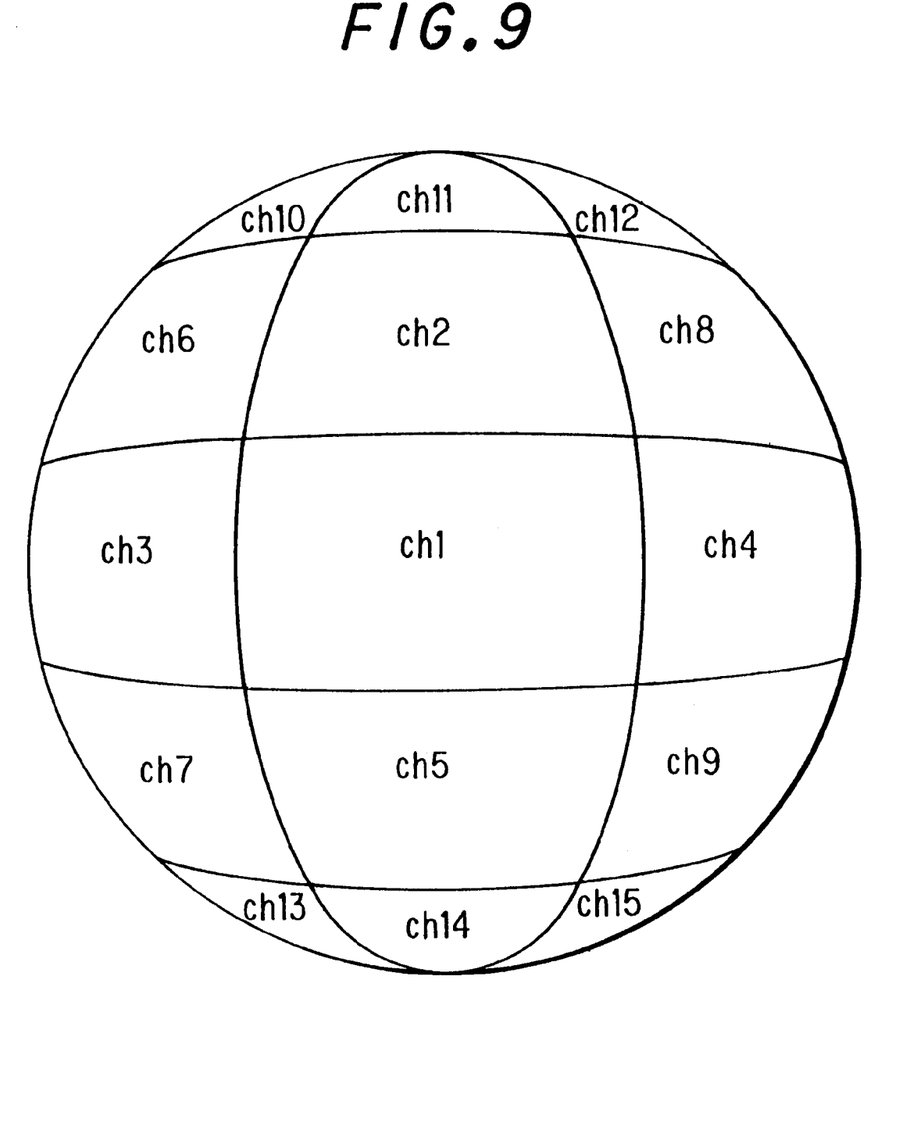
FIG. 9 is a view showing another display example of a multi-channel selector.

FIG. 9 shows another display example of a spherical multi-channel selector in which spherical area is partitioned by longitudinal lines and lateral parallel lines so that divided areas correspond to respective sub-frame images of channels.

Figure 10:
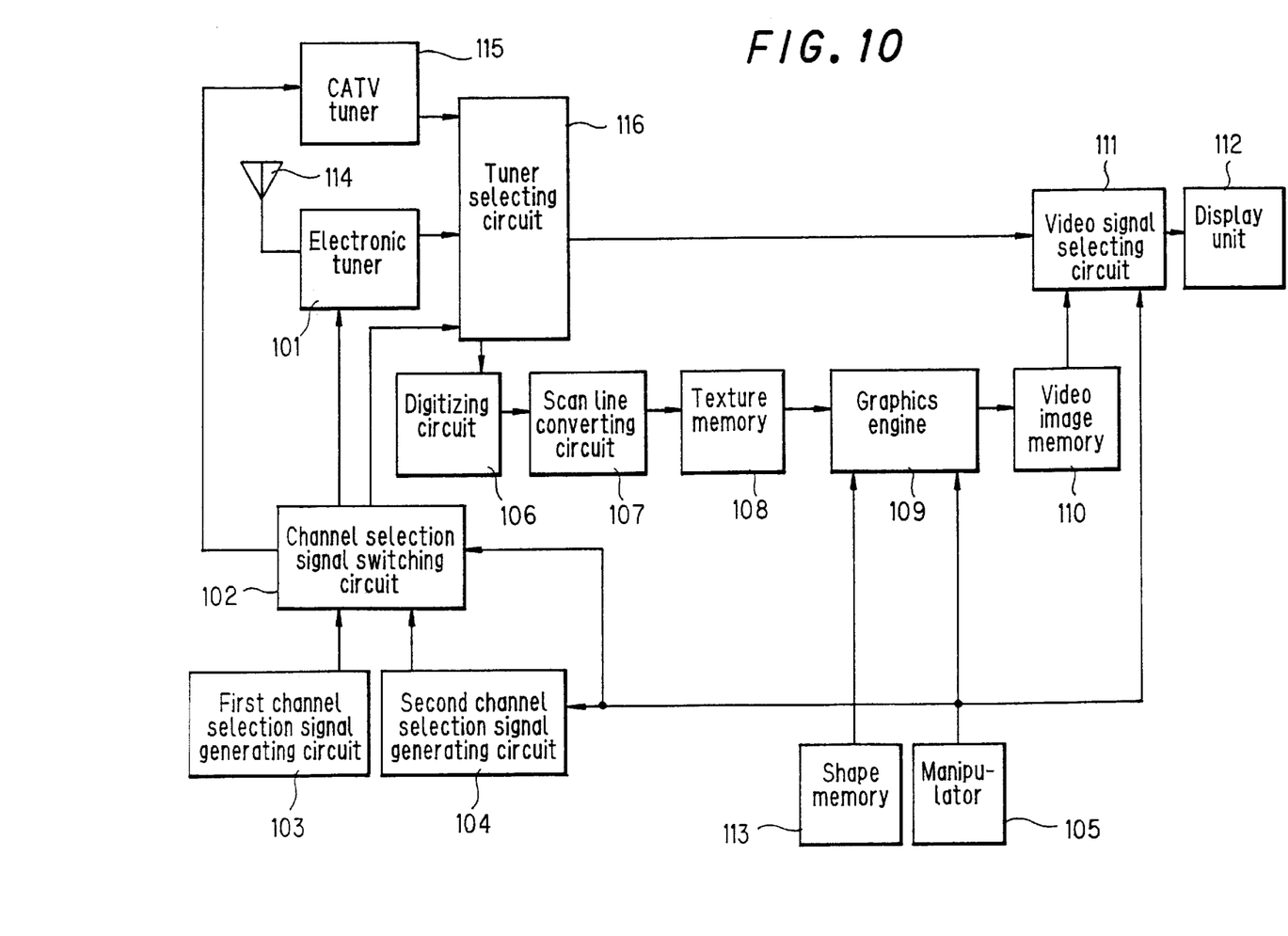
FIG. 10 is a block diagram showing a channel selecting system according to the second embodiment of the invention.

FIG. 10 is a block diagram showing a channel selecting system according to the second embodiment of the invention. As compared to the channel selecting system of FIG. 1, a CATV tuner 115 and a tuner selecting circuit 116 are added. An electronic tuner 101 receives ground TV broadcasting signals while CATV tuner 115 receives cable TV broadcasting signals. A channel selection signal switching circuit 102, in response to a tuner switching signal from a manipulator 105, selects one channel selection signal, the output from a first channel selection signal generating circuit 103 or from a second channel selection signal generating circuit 104 to output it to electronic tuner 101 or CATV tuner 115. Either electronic tuner 101 or CATV tuner 115 is selected by tuner selecting circuit 116 and the output from the selected one is connected to a video signal selecting circuit 111. Other configurations are the same as in the channel selecting system of the first embodiment.

Figure 11:
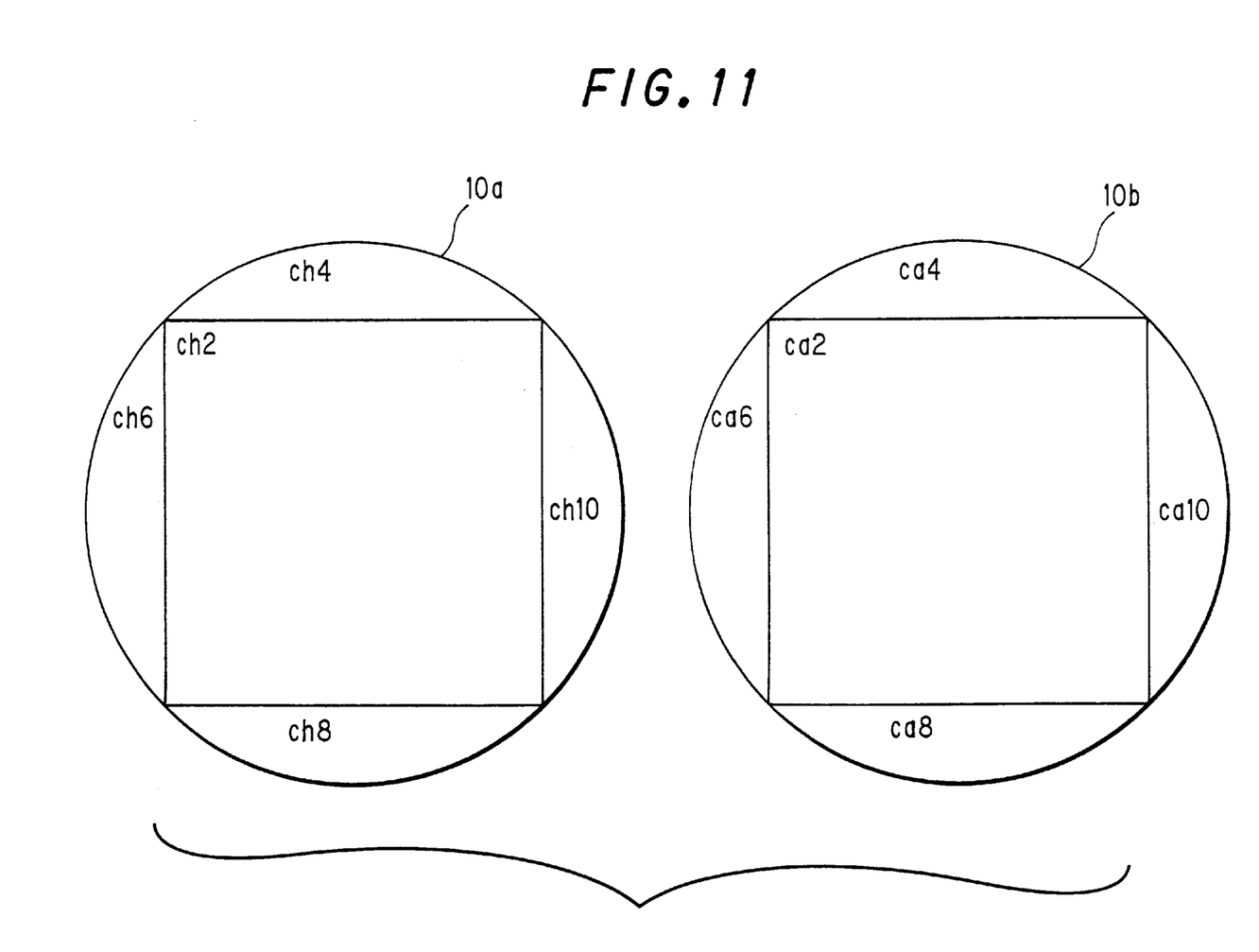
FIG. 11 is a view showing multi-channel selectors displayed on a display unit.

FIG. 11 is a multi-channel selector displayed on a display unit 112 for the channel selecting system of this embodiment. A pair of multi-channel selectors 10a and 10b are displayed respectively for electronic tuner 101 and CATV tuner 115. Displayed on multi-channel selector 10a and 10b are the ground TV broadcasting (ch.2–ch.10) and the cable TV broadcasting (ca.2–ca.10), respectively.

Figure 12:
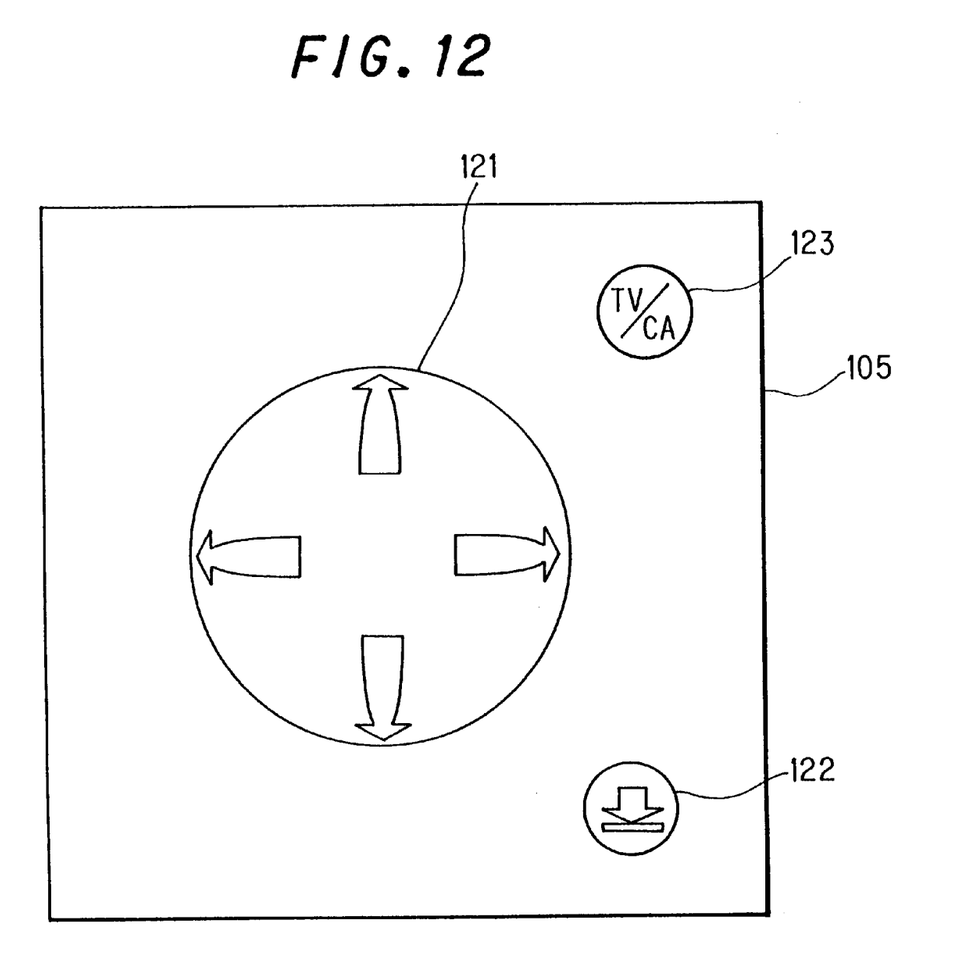
FIG. 12 is a view showing an example of a manipulator.

FIG. 12 shows manipulator 105 for channel selecting system of this embodiment. A track ball 121 is used to indicate the rotation of the multi-channel selector, up or down, left or right. A display selecting key 122 is used to effect switching between the video image display from electronic tuner 101 and the display of the multi-channel selector. A tuner selecting key 123 is used to select electronic tuner 101 or CATV tuner 115.

Upon the channel selection in channel selecting system of this embodiment, electronic tuner 101 or CATV tuner 115 is selected by tuner selecting key 123. As a result, track ball 121 is made active for multi-channel selector 10a or 10b corresponding to the selected tuner so that the rotation of the sub-frame images each corresponding to one channel can be selected. Then, the selected channel will be displayed on the display screen, by the operation of the display selecting key 122. Other channel selecting operations are the same as in the channel selecting system of the first embodiment.

As stated above, when one of the polyhedral icons respectively corresponding to electronic tuner 101 and CATV tuner 115 is selected and then a channel of the front-positioned sub-frame image is selected, the viewer can select a channel through the selected tuner, watch the video image thereof.

The rotational instructions of the multi-channel selector, up or down, left or right, can be performed using a joystick or mouse in place of a track ball. When a joystick is used, the display selecting key may be provided on the top of the joy stick so as to improve the operability. When a mouse is used, the display selecting key and tuner selecting key can be arranged on the mouse so as to improve the operability.

As a variation of this embodiment the tuner for ground broadcasting and the tuner for satellite broadcasting (BS broadcasting and CS broadcasting) may be combined. Alternatively, it is also possible to form combination with a receiving system from other media. Moreover, three or more tuners can be provided in correspondence with respective multi-channel selectors, to achieve channel selection.

As described heretofore, in accordance with the channel selecting system of the first feature of the invention, it is possible for the viewer to simultaneously watch in a three-dimentional representation a plurality of channels received through the tuner circuit using a polyhedral icon constituted by the faces of sub-frame images of the channels. Further, it is possible to see any one channel of the sub-frame images at the front position by rotating the polyhedral icon. This configuration allows the viewer to recognize the images of multiple channels and to observe a desired channel without large distortion together with other channels displayed in relatively small size, thus producing a display which gives the viewer a natural, 3-dimensional sensation.

In accordance with the channel selecting system of the second feature of the invention, when the channel of the sub-frame image at the front position is chosen, the tuner circuit can select this chosen channel allowing a display of this selected video image. Accordingly, it is possible for the viewer to only perform simple manipulation to select a desired channel and display it.

The channel selecting system of the third feature of the invention has a plurality of tuner circuits and provide a plurality of polyhedral icons corresponding to respective tuner circuits. Therefore, it is possible for the viewer to simultaneously watch a plurality of channels received through each tuner circuit in a 3D display image. Further, it is possible to see any one channel of the sub-frame images at the front position by rotating the polyhedral icon. This configuration allows the viewer to recognize the images of multiple channels and to observe a desired channel without large distortion together with other channels displayed in relatively small size, thus producing a display which gives the viewer a natural, 3-dimensional sensation.

In accordance with the channel selecting system of the fourth feature of the invention, the system has a plurality of tuner circuits and provide a plurality of polyhedral icons corresponding to respective tuner circuits. By selecting these icons, when a channel of the sub-frame image at the front position is chosen, arbitrary channel of the selected tuner circuit is chosen, which makes possible to see a display of this selected video image. Accordingly, it is possible for the viewer to only perform simple manipulation to select a desired channel and display it.

In the channel selecting systems according to the fifth, sixth and seventh feature of the invention, it is possible to perform channel selection from a remote control transmitter. Therefore, the viewer can select a desired channel and display it by simple manipulation while watching the video image from any place.

The channel selecting systems according to the eighth through tenth features of the invention, can receive the ground TV broadcasting and the cable TV broadcasting. Polyhedral icons corresponding to respective tuner circuits are used to select a channel of the front-positioned sub-frame image, whereby it is possible to select an arbitrary channel of the ground TV broadcasting or the cable TV broadcasting and to watch the video image thereof. As a result, by a simple manipulation the viewer can select a desired channel from a large number of video media and display it.

The channel selecting systems according to the eleventh through thirteenth features of the invention, can receive the ground TV broadcasting and the satellite TV broadcasting. Polyhedral icons corresponding to respective tuner circuits are used to select a channel of the front-positioned sub-frame image, whereby it is possible to select an arbitrary channel of the ground TV broadcasting or the satellite TV broadcasting and to watch the video program thereof. As a result, by a simple manipulation the viewer can select a desired channel from a large number of video media and display it.

What is claimed is:

1. A channel selecting system comprising:

a tuner circuit which selectively receives one channel in accordance with an indication signal indicating a channel to be selected and demodulates a video signal of the one received channel;

a first channel selection indicating circuit for outputting to the tuner circuit indication signals which indicate a sequence of channels to be selected;

a sub-frame image generating means which samples the video signals of each channel outputted from the tuner circuit in response to the indication signals from the first channel selection indicating circuit, said sub-frame image generating means taking one frame for each channel at intervals of a predetermined period and reducing the number of horizontal line scans in the frames, thereby producing a sub-frame image for each channel to be outputted as video information;

a sub-frame image memory for storing the video information of each sub-frame image outputted from the sub-frame image generating means, at an address associated with the corresponding channel number;

an image processing means which forms a polyhedral icon having faces each being constituted from a sub-frame image for a respective channel stored in correspondence to a respective address in the sub-frame image memory, and subjects the polyhedral icon to a three-dimensional image processing;

a video image memory for storing the output from the image processing means; and a rotation instructing means for instructing a rotation of the polyhedral icon to the image processing means.

2. A channel selecting system according to claim 1, further comprising:

a channel selecting means for outputting a channel selection signal which determines the channel corresponding to a front-positioned sub-frame image of the polyhedral icon to be a specified channel;

a second channel selection indicating circuit which receives the channel selection signal and outputs an indication signal to instruct the tuner circuit to select the specified channel;

a video signal selecting circuit which selects either the video signal outputted from the tuner circuit or the video signal outputted from the video image memory and outputs the selected signal;

a display selecting means for designating the selection of either the video output from the tuner circuit or the video output from the video image memory to the video signal selecting circuit; and a channel selection switching circuit which selects either the output from the first channel selection indicating circuit or the output from the second channel selection indicating circuit in accordance with the instructions from the display selecting means, and outputs the selected output to the tuner circuit.

3. A channel selecting system comprising:

a first tuner circuit which selectively receives one channel from a first broadcasting source in accordance with an indication signal indicating a channel to be selected and demodulates a video signal of the one received channel;

a second tuner circuit which selectively receives one channel from a second broadcasting source in accordance with an indication signal indicating a channel to be selected and demodulates a video signal of the one received channel;

a tuner selecting circuit for switching between the output from the first tuner circuit and the output from the second tuner circuit;

a first channel selection indicating circuit for outputting to the first tuner circuit or the second tuner circuit indication signals which indicate a sequence of channels to be selected;

a sub-frame image generating means which samples the video signals of each channel outputted from the first tuner circuit or the second tuner circuit in response to the indication signals from the first channel selection indicating circuit, said sub-frame image generating means taking one frame for each channel at intervals of a predetermined period and reducing the number of the horizontal scan lines in the frames, thereby producing a sub-frame image for each channel to be outputted as video information;

a sub-frame image memory for storing the video information of each sub-frame image outputted from the sub-frame image generating means, at an address associated with the corresponding channel number received by the first tuner circuit or the second tuner circuit;

an image processing means which forms for each of the first tuner circuit and the second tuner circuit, a polyhedral icon having faces each being constituted from a sub-frame image for a respective channel stored in correspondence to a respective address in the sub-frame image memory, and subjects the polyhedral icon to a three-dimensional image processing;

a video image memory for storing the output from the image processing means;

a rotation instructing means for instructing a rotation of the polyhedral icon corresponding to the first tuner circuit or the second tuner circuit to the image processing means; and a reception selecting means for selecting one of the polyhedral icons corresponding to the first or second tuner circuit and outputting instructions for switching to the tuner selection circuit.

4. A channel selecting system according to claim 3, further comprising:

a channel selecting means for outputting a channel selection signal which determines the channel corresponding to a front-positioned sub-frame image of the polyhedral icon to be a specified channel;

a second channel selection indicating circuit which receives the channel selection signal and outputs an indication signal to instruct the first or second tuner circuit to select the specified channel;

a video signal selecting circuit which selects either the video signal outputted from the first or second tuner circuit or the video signal outputted from the video image memory and outputs the selected signal;

a display selecting means for designating the selection of either the video output from the first or second tuner circuit or the video output from the video image memory; and a channel selection switching circuit which selects either the output from the first channel selection indicating circuit or the output from the second channel selection indicating circuit in accordance with the instructions from the display selecting means, and outputs the selected output to the first or second tuner circuit.

5. A channel selecting system according to claim 2, further comprising:

a remote control transmitter; and a receiver circuit for receiving the transmission signal from the remote control transmitter, wherein the remote control transmitter comprises the rotation instructing means, the channel selecting means and the display selecting means, and the rotation instructing means instructs the image processing means for three-dimensional image processing to make a rotation of the polyhedral icon in an up/down or left/right direction.

6. A channel selecting system according to claim 4, further comprising:

a remote control transmitter; and a receiver circuit for receiving the transmission signal from the remote control transmitter, wherein the remote control transmitter comprises the rotation instructing means, the channel selecting means and the display selecting means, and the rotation instructing means instructs the image processing means for three-dimensional image processing to make a rotation of the polyhedral icon corresponding to the first or second tuner circuit, in an up/down or left/right direction.

7. A channel selecting system according to claim 4, further comprising:

a remote control transmitter; and a receiver circuit for receiving the transmission signal from the remote control transmitter, wherein the remote control transmitter comprises the rotation instructing means, the channel selecting means, the display selecting means and the reception selecting means, and the rotation instructing means instructs the image processing means for subjecting a polyhedral icon to a three-dimensional image process to make a rotation of the polyhedral icon corresponding to the first or second tuner circuit, in an up/down or left/right direction, and the reception selecting means selects either the polyhedral icon corresponding to the first tuner circuit or the polyhedral icon corresponding to the second tuner circuit and outputs switching instructions to the tuner selecting circuit.

8. A channel selecting system according to claim 3, wherein the first broadcasting source is a ground TV broadcasting source and the second broadcasting source is a cable TV broadcasting source.

9. A channel selecting system according to claim 4, wherein the first broadcasting source is a ground TV broadcasting source and the second broadcasting source is a cable TV broadcasting source.

10. A channel selecting system according to claim 7, wherein the first broadcasting source is a ground TV broadcasting source and the second broadcasting source is a cable TV broadcasting source.

11. A channel selecting system according to claim 1, wherein the first broadcasting source is a ground TV broadcasting source and the second broadcasting source is a satellite TV broadcasting source.

12. A channel selecting system according to claim 4, wherein the first broadcasting source is a ground TV broadcasting source and the second broadcasting source is a satellite TV broadcasting source.

13. A channel selecting system according to claim 7, wherein the first broadcasting source is a ground TV broadcasting source and the second broadcasting source is a satellite TV broadcasting source.

14. A channel selecting system according to claim 1, wherein the rotation instructing means instructs an up, down, left or right rotation to the image processing means.

15. A channel selecting system according to claim 3, wherein the rotation instructing means instructs an up, down, left or right rotation to the image processing means.

16. A channel selecting system according to claim 1, further comprising:

a shape memory for storing three-dimensional shape data represented by three dimensional coordinates; and a view field transforming circuit, wherein said three dimensional shape data read out from said shape memory is subject to rotation by multiplying with a view-field transformation matrix.

17. A channel selecting system comprising:

a tuning circuit configured to tune a particular channel and demodulate a video signal of the tuned channel;

a first channel selection signal generating circuit configured to output to the tuner circuit indication signals for causing the tuner circuit to successively tune to each channel of a sequence of channels;

channel image generating circuitry configured to generate respective images from the video signals of each channel of the sequence of channels tuned by the tuning circuit;

icon image generating circuitry configured to generate a three-dimensional polyhedral icon for display on a display unit, the three-dimensional polyhedral icon having faces each of which is constituted by the image generated by the channel image generating circuitry for one particular channel of the sequence of channels; and a second channel selection signal generating circuit configured to be responsive to user inputs to select one of the channels whose image constitutes a face of the three-dimensional polyhedral icon.

18. A channel selecting system according to claim 17, wherein the icon image generating circuitry rotates the three-dimensional polyhedral icon in response to rotation instructions.

19. A channel selecting method, comprising:

successively tuning to each of a plurality of channels;

generating respective images from video signals of each channel of the successively tuned channels;

generating a three-dimensional polyhedral icon, the three-dimensional polyhedral icon having faces each of which is constituted by the image generated for one particular channel of the successively tuned channels;

displaying the three-dimensional polyhedral icon on a display unit; and selecting one of the channels whose image constitutes a face of the three-dimensional polyhedral icon.

20. A channel selecting method according to claim 19, further comprising:

rotating the displayed three-dimensional polyhedral icon in response to rotation instructions.

* * * * *